US011982711B2

(12) United States Patent
Tang et al.

(10) Patent No.: US 11,982,711 B2
(45) Date of Patent: May 14, 2024

(54) METHOD FOR DIAGNOSING SWITCH FAULT AND/OR PHASE LOSS IN INVERTER

(71) Applicant: NXP USA, Inc., Austin, TX (US)

(72) Inventors: Huabiao Tang, Shanghai (CN); Junjie Lai, Chongqing (CN)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/817,381

(22) Filed: Aug. 4, 2022

(65) Prior Publication Data

US 2024/0003976 A1 Jan. 4, 2024

(30) Foreign Application Priority Data

Jul. 4, 2022 (CN) .......................... 202210781850.4

(51) Int. Cl.
  *G01R 31/34* (2020.01)
  *G01R 15/04* (2006.01)
  *G01R 19/00* (2006.01)

(52) U.S. Cl.
  CPC ............ *G01R 31/343* (2013.01); *G01R 15/04* (2013.01); *G01R 19/0084* (2013.01)

(58) Field of Classification Search
  CPC ...... G01R 31/00; G01R 31/34; G01R 31/343; G01R 19/00; G01R 19/0084; G01R 19/0092; G01R 15/00; G01R 15/04
  USPC ................................. 324/500, 503, 415–424
  See application file for complete search history.

(56) References Cited

U.S. PATENT DOCUMENTS

| 7,161,375 B2 | 1/2007 | Ho | |
|---|---|---|---|
| 11,789,080 B2 * | 10/2023 | Kim | ...................... H02P 29/024 |
| | | | 324/765.01 |
| 2006/0055419 A1 * | 3/2006 | Paulson | ............... H02H 7/0833 |
| | | | 324/765.01 |

FOREIGN PATENT DOCUMENTS

| CN | 103744013 B | 6/2016 | | |
|---|---|---|---|---|
| CN | 105629122 A | 6/2016 | | |
| JP | 2010119253 A | * | 5/2010 | ................ H02P 3/18 |
| WO | WO-2015022718 A1 | * | 2/2015 | ............ B62D 5/0484 |

OTHER PUBLICATIONS

Lorincz et al, "Hardware Implementation of BLDC Motor Diagnosis," specification (2007-2013) ISBN: 978-1-61804-017-6, pp. 202-207.

* cited by examiner

*Primary Examiner* — Hoai-An D. Nguyen

(57) ABSTRACT

Methods of testing, diagnosing, or assessing the functionality of switches of an electric motor control system and/or a phase loss of an electric motor, and electric motor systems/motor control systems employing such methods, are disclosed herein. In one example embodiment, a method of diagnosing a fault includes detecting respective phase voltage signals communicated from the first, second, and third output nodes indicative of respective phase voltages occurring at the first, second, and third output nodes, respectively, and determining whether the respective phase voltages indicate that a first fault has occurred, either with respect to one or more transistors of pairs of switching transistors or with respect to one or more of first, second, and third phase windings. The determining is based upon whether the respective phase voltage signals indicate that respective phase voltages present respectively at the output nodes are (Continued)

equal or substantially equal to an intermediate output voltage.

20 Claims, 4 Drawing Sheets

METHOD FOR DIAGNOSING SWITCH FAULT AND/OR PHASE LOSS IN INVERTER

FIELD OF THE DISCLOSURE

The present disclosure relates to methods and systems for testing, diagnosing, or assessing the functionality of electric motor control systems or controllers and/or electric motors and, more particularly, relates to methods and systems for testing, diagnosing, or assessing the functionality of switches of such a controller and/or a phase loss of an electric motor.

BACKGROUND OF THE DISCLOSURE

Electric motor control systems or controllers such as inverters typically employ power semiconductor switches. Although such switches are highly reliable, nevertheless it is desirable to verify that any such switches of a motor controller are operational, and can be particularly important to diagnose any motor controller switch failures when the motor controller and any associated motor are in the off state (e.g., before starting the motor). A conventional method for diagnosing such switch failures is to turn specific switches of a group ON and to check the expected current feedback. Alternatively, in accordance with other conventional methods, switch failures can be diagnosed using complicated external resistance networks or dedicated circuits to diagnose the switch faults by performing voltage comparisons.

Notwithstanding the existence of such conventional methods for diagnosing such switch faults, such conventional methods are inadequate in certain respects. In particular, in some cases using such conventional methods, if one switch of the motor controller is already shorted to battery or ground, the turn on switch behaviour may bring inrush current, which may be undesirable in terms of negatively impacting future system performance.

For at least one or more of these reasons, or one or more other reasons, it would be advantageous if new or improved methods of testing, diagnosing, or assessing the functionality of electric motor control systems or controllers or components thereof (e.g., inverters), and/or associated systems for doing so, could be developed so as to address any one or more of the concerns discussed above or to address one or more other concerns or provide one or more benefits.

DETAILED DESCRIPTION

Figure 1:
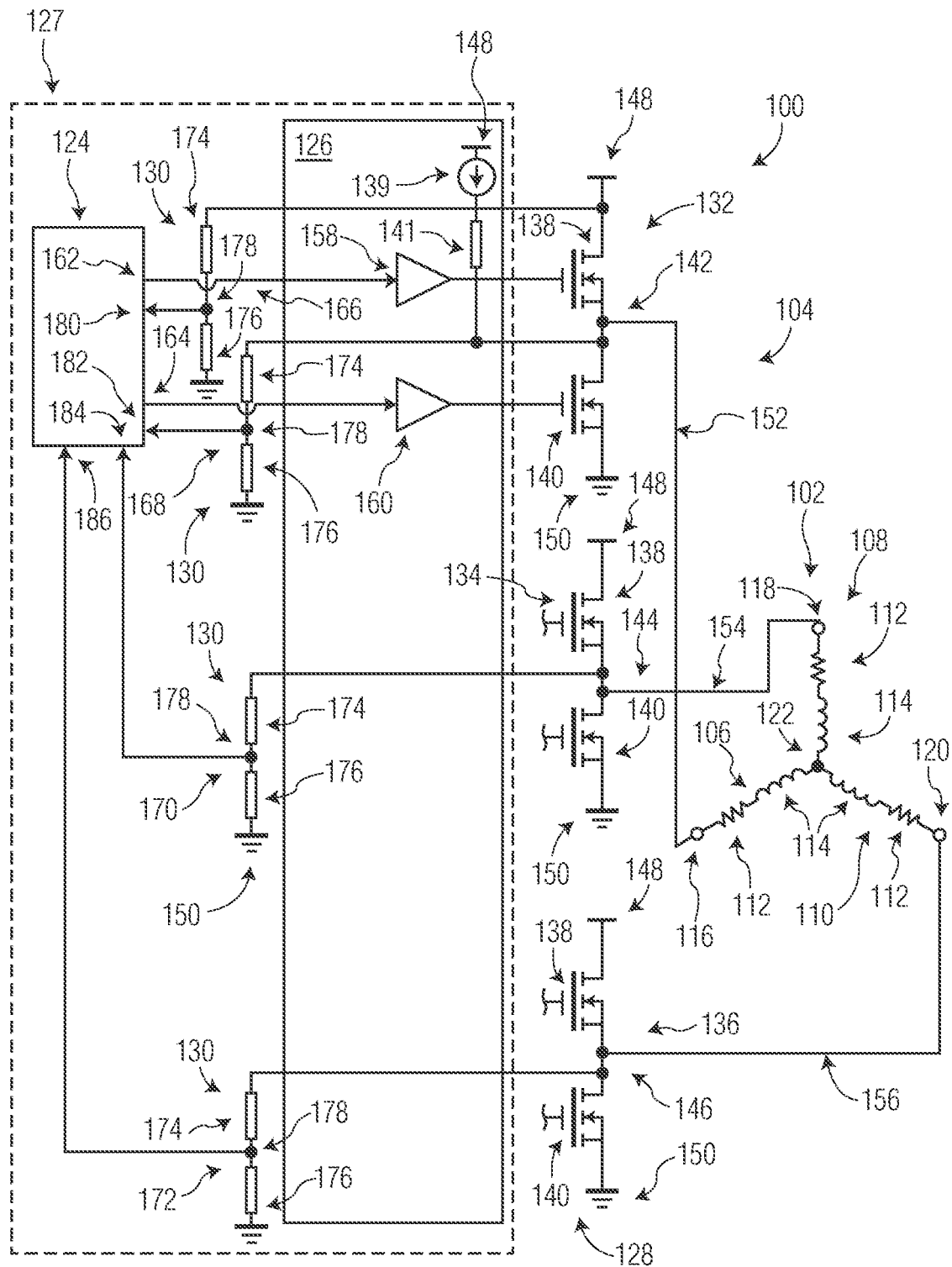
FIG. 1 is a schematic diagram of an example electric motor system including an electric motor and an electric motor control system that is configured to perform an example fault testing method in accordance with a first embodiment encompassed herein.

The present disclosure relates to methods and systems for testing, diagnosing, or assessing the functionality of electric motor control systems or controllers and/or electric motors. In at least some embodiments encompassed here, the methods are employed in relation to motor control systems/controllers having inverter bridges in which inverters are controlled to drive current through the phases of a motor, where the inverters include respective pairs of series-coupled switching transistors coupled together at respective output nodes that are coupled to the respective phases of the motor. The methods make use of a non-zero, stable, intermediate output, expected phase voltage value (referred to generally herein as "$V_{PHX-OFF}$"), which is independent of the power supply and not zero, and which appears at the respective output node of each series-coupled switching transistor pair when both of the transistors of the pair are switched off. By detecting the appearance (or absence) of that intermediate output voltage, the methods can distinguish between an "off" state in which both of the series-coupled switching transistors of a given pair are both switched off (which can occur when the control system/controller is in an "off" state overall), and other states in which one of those transistors of the pair is switched on. More particularly, by detecting the appearance (or absence) of that intermediate output voltage, the methods can distinguish between the aforementioned "off" state and a "bottom switch on" state, in which only that one of the transistors of the given pair which is coupled between the respective output node and ground is switched on.

In at least some embodiments encompassed herein, the methods can be utilized to detect not only switch faults of the switching transistors of the inverters (including switch short faults and switch open faults) but also a motor phase loss, for example, when the wiring (e.g., stator coil) associated with one of the motor phases ceases to conduct current or operate. Also, in at least some such embodiments, the methods can be utilized to detect both switch faults and motor phase losses at the same (or substantially the same) time, when the motor control system/controller and associated motor are both in the off state, just by one process. In at least some embodiments, the two states combine with a "top switch on" state, which can diagnose the switches short or open fault and motor phase loss fault by a specific detection process in the motor "off" state. Further, in at least some embodiments, the methods operate by checking the respective voltages output at the respective output nodes ("phase voltages") when each inverter (or control system/controller overall) is in the "off" state before the respective switches (transistors) are turned, and then by detecting the respective phase voltages as different ones of the switches are turned on one by one, so that there is no (or not any significant) concern about inrush current.

Thus, the present disclosure in at least some embodiments relates to methods of diagnosing switch short faults, switch open faults, and motor phase losses at the same (or substantially the same) time when the motor controller is in the OFF state, by way of a single process. Also, in at least some embodiments, the present disclosure relates to methods for diagnosing inverter bridge switch faults (including switch short and switch open faults) and motor phase losses in an off state by way of voltage comparisons. At least some of the methods disclosed herein can be useful in testing, diagnosing, or assessing the functionality of motor control systems/controllers and associated motors or motor applications, such as brushless direct current (BLDC) motors, permanent magnet synchronous motors (PMSMs) or direct current (DC) motor applications, when the motor control systems/controllers and associated motors/motor applications are in the off state (e.g., before any motor is started). Additionally, by comparison with conventional methods, at least some of the methods encompassed herein are advantageous at least insofar as such methods can be performed without complicated external circuits (that is, without complicated testing circuits that are external of the motor control systems/controllers and associated motors/motor applications), and can be performed without (or without substantial) inrush currents occurring if switch short faults have occurred. Further, at least some of the methods encompassed herein are advantageous in that the methods can be easily implemented and operated to achieve detection of switch short faults, detection and tracing of switch open faults, and detection and tracing of motor phase loss faults by way of only a single process.

Referring to FIG. 1, a schematic diagram is provided to show an electric motor system 100 that includes each of an electric motor 102 and an electric motor control system (or electric motor controller) 104 coupled with one another. As will be described herein, the electric motor system 100, and particularly the electric motor control system 104, can be operated in accordance with one or more methods encompassed herein so as to allow for the presence of one or more faults associated with the electric motor system 100 to be determined or detected.

The electric motor 102 can be, for example, a brushless direct current (BLDC) motor, a permanent magnet synchronous motor (PMSM), or another type of motor. Although it should be appreciated that the electric motor 102 will have both a stator and a rotor, the electric motor is represented schematically as having first, second, and third phase windings 106, 108, and 110 of the stator in particular. That is, each of the first, second, and third phase windings 106, 108, and 110 can be representative of a respective stator coil of the electric motor 102, and is further illustrated as having a respective resistor 112 and a respective inductor 114 that are coupled in series with one another. Further the respective first, second, and third phase windings 106, 108, and 110 are respectively coupled between respective first, second, and third input nodes (or ports) 116, 118, and 120, respectively, and a central node 122, in a Y-type arrangement. The first, second, and third input nodes 116, 118, and 120 also are considered to constitute respectively phase A, phase B, and phase C input nodes of the electric motor 102. Although the phase windings 106, 108, and 110 shown in FIG. 1 are intended to be representative of coils provided on a stator of the electric motor, the present disclosure is also intended to encompass embodiments in which the phase windings are representative of coils provided on a rotor of the electric motor.

FIG. 1 additionally shows components of the electric motor control system 104 that is coupled to the electric motor 102. More particularly, the electric motor control system 104 includes a microcontroller unit 124, a driver 126, an inverter bridge 128, and a plurality of resistor dividers 130. As shown, the inverter bridge 128 particularly includes first, second, and third pairs of switching transistors 132, 134, and 136, respectively, each of which includes a respective top transistor 138 and a respective bottom transistor 140 that are coupled in series with one another. Each of the top transistors 138 and each of the bottom transistors 140 in the present embodiment can take the form of a respective metal oxide semiconductor field effect transistor (MOSFET) having each of respective source, drain, and gate terminals, although the transistors can also take other forms in other embodiments. In the present embodiment, the respective drain terminal of each of the top transistors 138 of each of the respective pairs of switching transistors 132, 134, and 136 is directly coupled to a non-zero bias voltage source 148 (HD), and the respective source terminal of each of the bottom transistors 140 of each of the respective pairs of switching transistors is directly coupled to a ground (or ground terminal) 150. Further, the respective source terminal of each of the top transistors 138 of each of the respective pairs of switching transistors 132, 134, and 136 is directly coupled to the respective drain terminal of each of the bottom transistors 140 of each of the respective pairs of switching transistors, at respective first, second, and third phase output nodes (or simply first, second, and third output nodes) 142, 144, and 146, respectively. The first, second, and third phase output nodes 142, 144, and 146 also respectively are considered to constitute phase A, B, and C output nodes (or ports), respectively, of the electric motor control system 104.

Further as shown, the first, second, and third output nodes 142, 144, and 146 are respectively directly coupled with the respective first, second, and third input nodes 116, 118, and 120 of the electric motor 102 by way of respective first, second, and third links 152, 154, and 156. Accordingly, the first, second, and third output nodes 142, 144, and 146 can respectively be considered as constituting the same electrical nodes as the first, second, and third input nodes 116, 118, and 120. Given this to be the case, respective output voltages occurring at the respective first, second, and third nodes 142, 144, and 146 are applied to the respective first, second, and third input nodes 116, 118, and 120 of the electric motor 102, and are referred to herein as a phase A voltage ($V_{PHA}$), a phase B voltage ($V_{PHB}$), and a phase C voltage ($V_{PHC}$), respectively. Further, given this nomenclature, each of the respective output voltages occurring at the respective first, second, and third output nodes 142, 144, and 146 can be referred to herein generically as a respective phase X voltage ($V_{PHX}$).

The operation of the pairs of switching transistors 132, 134, 136, in terms of on and off status, is governed by signals provided via the driver 126, as controlled by way of the microcontroller unit 124. Each of the top transistors 138 is driven by way of a respective drive-high ("DRV-H") circuit 158 of the driver 126 that is coupled between the microcontroller unit 124 and the respective gate of the respective top transistor. More particularly, each of the respective drive-high circuits 158 can be, for example, a pre-driver chip (or chips), bootstrap circuit or charge pump. As shown, each of the respective drive-high circuits 158 can have a respective input port that is coupled to a respective pulse width modulation-high (PWM-H) output port 162 of the microcontroller unit 124, and a respective output port that is coupled to a respective gate of a respective one of the top transistors 138. Likewise, each of the bottom transistors 140 is driven by way of a respective drive-low ("DRV-L") circuit 160 of the driver 126 that is coupled between the microcontroller unit 124 and the respective gate of the respective bottom transistor. More particularly, each of the respective drive-low circuits 160 can be, for example, a level shift circuit (which usually is a push-pull output). As shown, each of the respective drive-low circuits 160 can have a respective input port that is coupled to a respective pulse width modulation-low (PWM-L) output port 164 of the microcontroller unit 124, and a respective output port that is coupled to a respective gate of a respective one of the bottom transistors 140.

Notwithstanding the above description, to facilitate illustration of this circuitry, FIG. 1 only shows the drive-high circuit 158 and drive-low circuit 160 having output ports that are respectively coupled to the respective top transistor 138 and respective bottom transistor 140 of the first pair of switching transistors 132, and only shows the respective PWM-H output port 162 and PWM-L output port 164 coupled to those drive-high and drive-low circuits. Correspondingly, the respective gates of the respective top transistors 138 and bottom transistors 140 of the second and third pairs of switching transistors 134 and 136 are shown in a cutaway manner and to not be coupled to any other components. Nevertheless, it should be appreciated that the electric motor control system 104 does also include additional respective drive-high circuits 158, as well as respective PWM-H output ports 162 to which the respective input ports of those drive-high circuits are coupled, which have respective output ports that are coupled to the respective gates of the respective top transistors 138 of the second and third pairs of switching transistors 134 and 136. Likewise, it should be appreciated that the electric motor control system 104 does also include additional respective drive-low circuits 160, as well as respective PWM-L output ports 164 to which the respective input ports of those drive-low circuits are coupled, which have respective output ports that are coupled to the respective gates of the respective bottom transistors 138 and 140 of the second and third pairs of switching transistors 134 and 136.

As for the resistor dividers 130, the electric motor control system 104 includes first, second, third, and fourth resistor dividers 166, 168, 170, and 172, respectively, each of which includes a respective upper resistor 174 and a respective lower resistor 176 coupled together at a respective node 178. Further as shown, the first resistor divider 166 is coupled between the non-zero bias voltage source 148 and the ground terminal 150, and is suited to serve as a resistor divider for bias voltage sampling. In this regard, the respective upper resistor 174 is coupled between the non-zero bias voltage source 148 and the respective node 178 of the first resistor divider 166, the respective lower resistor 176 is coupled between the respective node and the ground terminal 150, and the respective node 178 is additionally coupled to a first analog-to-digital converter ("ADC") port 180 of the microcontroller unit 124.

Additionally, the second, third, and fourth resistor dividers 168, 170, and 172 are respectively coupled between the respective first, second, and third output nodes 142, 144, and 146, respectively, and the ground terminal 150, and are suited to serve as resistor dividers for phase voltage sampling. In this regard, the respective upper resistor 174 of each of the second, third, and fourth resistor dividers 168, 170, and 172 is coupled between the respective first, second, and third output nodes 142, 144, and 146, respectively, and the respective node 178 of the second, third, and fourth resistor dividers. Further, the respective lower resistor 176 of each of the second, third, and fourth resistor dividers 168, 170, and 172 is coupled between the respective node 178 of the respective resistor divider and the ground terminal 150. Also, the respective nodes 178 of the respective second, third, and fourth resistor dividers 168, 170, and 172 are respectively coupled to second, third, and fourth ADC ports 182, 184, and 186, respectively, of the microcontroller unit 124.

It should also be appreciated that, in addition to being coupled to the second, third, and fourth resistor dividers 168, 170, and 172, each of the first, second, and third output nodes 142, 144, and 146 respectively also are coupled to the non-zero bias voltage source 148 by way of a respective current source device 139 and a respective additional resistor 141 coupled in series with one another between the bias voltage source and the respective output node (with the respective current source device being coupled between the bias voltage source and the respective additional resistor). In this regard, the current source device 139 and the additional resistor 141 linking the bias voltage source 148 with the first output node 142 particularly are shown but counterpart ones of the current source devices and additional resistors linking the bias voltage source with the second and third output nodes 144 and 146 are omitted for clarity in FIG. 1. Nevertheless, it should be understood that respective series combinations of current source devices and additional resistors are present in this embodiment between the bias voltage source and each of the respective output nodes 142, 144, and 146.

During normal or proper operation of the electric motor system 100, each of the first, second, and third pairs of switching transistors 132, 134, 136 can take on any of first, second, and third states of operation, as governed by signals provided via the driver 126 as controlled by way of the microcontroller unit 124. These first, second, and third states of operation are illustrated in Table 1. As shown, in a first state of operation (State 1) for any of the first, second, and third pairs of switching transistors 132, 134, and 136, the respective top transistor 138 (Xt, that is, any of At, Bt, or Ct for the different respective pairs of switching transistors 132, 134, and 136) and the respective bottom transistor 140 (Xb, that is, any of Ab, Bb, or Cb for the different respective pairs of switching transistors) of that respective pair of switching transistors is switched off so as to be non-conductive. In this circumstance, the expected phase voltage ($V_{PHX}$, that is, any of $V_{PHA}$, $V_{PHB}$, or $V_{PHC}$) at the respective output node 142, 144, or 146 for the respective pair of switching transistors 132, 134, and 136 will be nonzero.

More particularly, in the present embodiment, the expected phase voltage ($V_{PHX}$) particularly will equal or be substantially equal to 0.35 Volts. This 0.35 Volt value is based on an assumption that the electric motor control system 104 in which the pairs of switching transistors 132, 134, and 136 are provided is or includes a pre-driver provided by a S12ZVML128 (GDUV4) microcontroller, which is a microcontroller from the 16-bit S12 MagniV® S12ZVM mixed-signal microcontroller family, or provided in a GD3000 gate driver integrated circuit, all of which are made available by NXP Semiconductors, N.V. of Eindhoven, Netherlands. However, in other embodiments (e.g., involving other pre-drivers), this expected phase voltage ($V_{PHX}$) can take on other values. For example, if one assumes that the pairs of switching transistors 132, 134, and 136 are provided as part of a S12ZVML31 (GDUV5) microcontroller, as is also available from NXP Semiconductors, N.V., the expected phase voltage will equal or be substantially equal to 0.09V and, in other embodiments the expected phase voltage will take on other values. Also, in at least some embodiments, the expected phase voltage ($V_{PHX}$) can be calibrated offline.

Additionally, in a second state of operation (State 2) for any of the first, second, and third pairs of switching transistors 132, 134, and 136, the respective top transistor 138 (Xt, that is, any of At, Bt, or Ct) is switched on so as to be conductive, but the respective bottom transistor 140 (Xb, that is, any of Ab, Bb, or Cb) is switched off so as to be non-conductive. In this circumstance, the expected phase voltage ($V_{PHX}$, that is, any of $V_{PHA}$, $V_{PHB}$, or $V_{PHC}$) at the respective output node 142, 144, or 146 for the respective pair of switching transistors 132, 134, and 136 in the present embodiment will be nonzero, and particularly will equal or be substantially equal to the bias voltage applied by the non-zero bias voltage source 148 ($V_{HD}$) Further, in a third state of operation (State 3) for any of the first, second, and third pairs of switching transistors 132, 134, and 136, the respective top transistor 138 (Xt, that is, any of At, Bt, or Ct) is switched off so as to be non-conductive, but the respective bottom transistor 140 (Xb, that is, any of Ab, Bb, or Cb) is switched on so as to be conductive. In this circumstance, the expected phase voltage ($V_{PHX}$, that is, any of $V_{PHA}$, $V_{PHB}$, or $V_{PHC}$) at the respective output node 142, 144, or 146 for the respective pair of switching transistors 132, 134, and 136 in the present embodiment will be zero due to the effective coupling of the respective output node to the ground terminal 150.

TABLE 1

| State | Top Switch Xt (At, Bt, or Ct) | Bottom Switch Xb (Ab, Bb, or Cb) | $V_{PHX}$-Phase PHX Expected Voltage ($V_{PHA}$, $V_{PHB}$, or $V_{PHC}$) |
|---|---|---|---|
| State 1 | Turn off | Turn off | $V_{PHX\text{-}OFF} = 0.35$ v |
| State 2 | Turn on | Turn off | $V_{HD}$ |
| State 3 | Turn off | Turn on | 0 |

Although Table 1 indicates the transistor actuations that cause each of the pairs of switching transistors 132, 134, and 136 to attain three states of operation during normal operation of the electric motor system 100, there can be occasions in which the electric motor system 100 experiences a fault and may not be operating properly. More particularly in regard, it should be appreciated that at least five different types of single point faults can occur in regard to electric motor systems such as the electric motor system 100 (e.g., DC/BLDC/PMSM motor applications that employ a bridge topology). Each of these five different types of single point faults can occur with respect to each of the phases of the electric motor system 100, that is, with respect to each of the first, second, and third pairs of switching transistors 132, 134, and 136 and/or with respect to each of the first, second, and third phase windings 106, 108, and 110 that are coupled respectively to those respective pairs of switching transistors. These five different types of single point faults are illustrated figuratively as first, second, third, fourth, and fifth faults by FIGS. 2, 3, 4, 5, and 6, respectively. Each of FIGS. 2, 3, 4, 5, and 6 particularly illustrates figuratively the first, second, third, fourth, and fifth faults when those respective faults occur in relation to the respective top and bottom transistors 138 and 140 of the first pair of switching transistors 132 and the counterpart first phase winding 106 (see FIG. 1) that is coupled to that pair of switching transistors. Nevertheless, it should be appreciated that each of the same five faults can also be experienced by the second and third pairs of switching transistors 134 and 136 and counterpart second and third phase windings 108 and 110.

Figure 4:
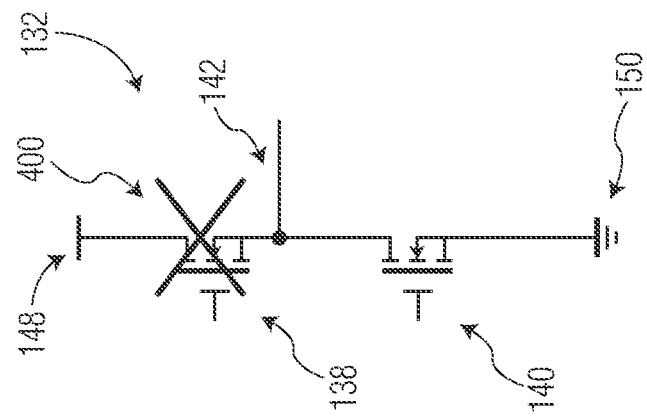
FIGS. 2, 3, 4, 5, and 6 are schematic diagrams that respectively illustrate first, second, third, fourth, and fifth types of faults that can be determined by way of the fault testing method that can be performed by the electric motor system of FIG. 1.
Figure 3:
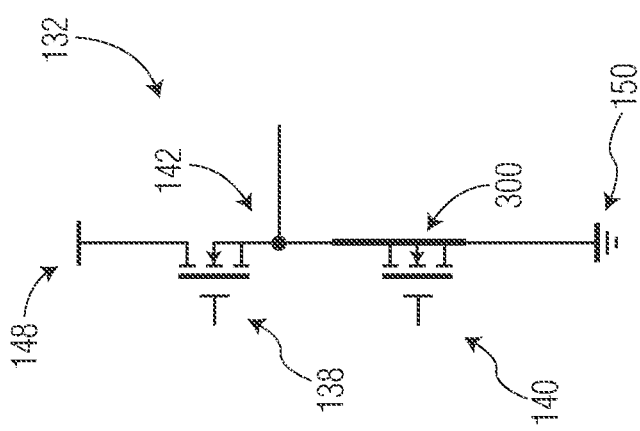
Figure 2:
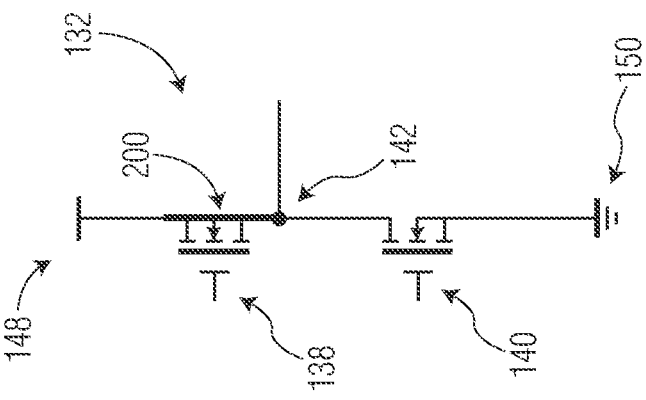
Figure 5:
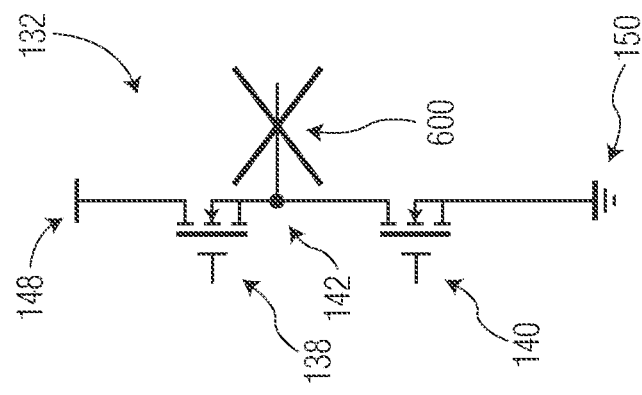
Figure 6:
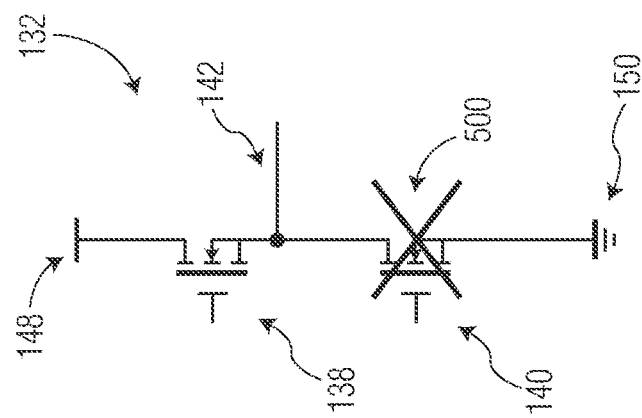

Further in this regard, FIG. 2 particularly illustrates the first fault in which the top transistor (or switch) 138 of the first pair of switching transistors 132 has experienced a short-circuit, such that the first output node 142 has been shorted to the non-zero bias voltage source 148 (to HD), as represented by a drain-to-source bridge connection (representing a short circuit) 200. In contrast, FIG. 3 illustrates the second fault in which the bottom transistor (or switch) 140 of the first pair of switching transistors 132 has experienced a short-circuit, such that the output node 142 has been shorted to the ground terminal 150, as represented by a drain-to-source bridge connection (representing a short circuit) 300. Also, FIG. 4 illustrates the third fault in which the top transistor (or switch) 138 of the first pair of switching transistors 132 is an open circuit, particularly between the drain and source terminals of that transistor, such that the output node 142 is open-circuited relative to the non-zero bias voltage source 148, as represented by an X 400. Additionally, FIG. 5 illustrates the fourth fault in which the bottom transistor (or switch) 140 of the first pair of switching transistors 132 is an open circuit, particularly between the drain and source terminals of that transistor, such that the output node 142 is open-circuited relative to the ground terminal 150, as represented by an X 500. Further, FIG. 6 illustrates the fifth fault in which there has been a motor phase loss, that is, where the first phase winding 106 of the electric motor 102 (see FIG. 1) has ceased to conduct/operate, as represented by an X 600.

As already described above, Table 1 illustrates states of operation of each of the pairs of switching transistors 132, 134, and 136 that occur when those pairs of switching transistors, and the phase windings 106, 108, and 110 coupled to those pairs of switching transistors, are operating normally. Based upon this information regarding normal (or expected) operation of the electric motor system 100, any of the different types of faults corresponding to the first, second, third, fourth, and fifth faults of FIGS. 2, 3, 4, 5, and 6, with respect to any of the pairs of switching transistors 132, 134, and 136 or phase windings 106, 108, and 110 of the electric motor system, can be detected. Indeed, whether the electric motor system 100 is operating properly, or instead a fault has occurred, can be determined by checking whether the three states shown in Table 1 are occurring as expected in response to the actuation of different ones of the top transistors 138 and bottom transistors 140 of the pairs of switching transistors 132, 134, and 136. That is, whether the electric motor system 100 is operating properly, or whether a fault has occurred, can be determined/detected by checking, by way of phase voltage sampling, whether each of the first, second, and third output nodes 142, 144, and 146 takes on the expected voltage levels in accordance with Table 1 in response to actuation of the top transistors 138 and bottom transistors 140 of the pairs of switching transistors 132, 134, and 136, respectively.

More particularly, in the present example embodiment, whether the electric motor system 100 is operating properly, or whether a fault has occurred, is determined in accordance with a testing process that is illustrated by way of a flow chart 720 shown in FIG. 7 and described further below. The testing process particularly involves voltage sampling by the microcontroller unit 124 of respective voltage signals concerning the phase voltages at the first, second, and third output nodes 142, 144, 146 in response to different actuations of the top and bottom transistors 138 and 140 of the pairs of switching transistors 132, 134, and 136. The steps of the testing process are typically performed at times when the electric motor 102 is not operating (e.g., prior to switching on the electric motor for operation). Depending upon the particular results that are obtained through the voltage sampling performed during the steps of the testing process, determinations are made by the microcontroller unit 124 as to whether any fault has occurred or whether the electric motor system 100 is operating in a desired, normal manner.

Figure 7:
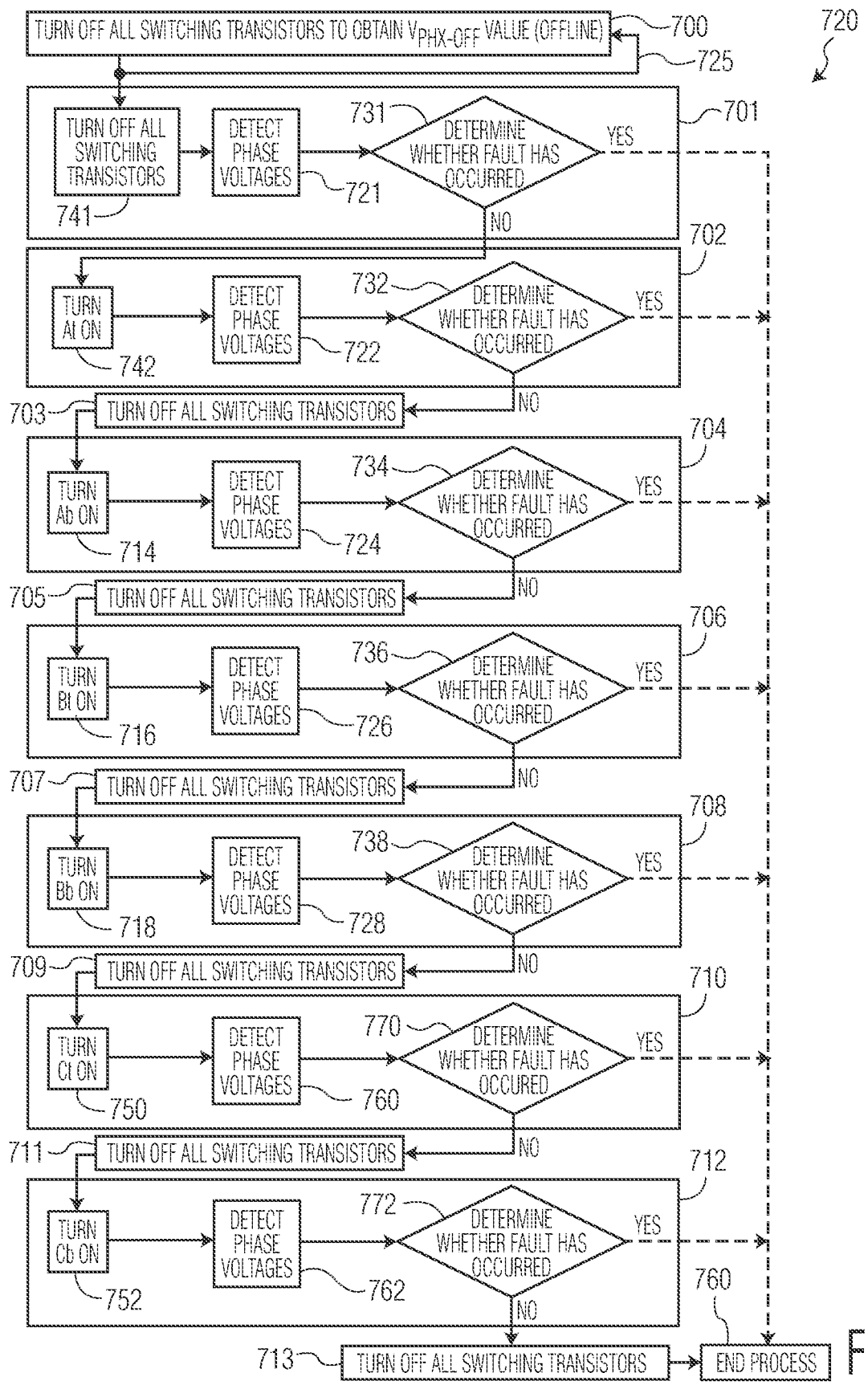
FIG. 7 is a flow chart illustrating example steps of the example fault testing method that can be performed by the electric motor system of FIG. 1.

The voltage sampling performed by the microcontroller unit 124 during the testing process of FIG. 7 particularly involves determining whether the phase voltages at the respective output nodes 142, 144, and 146 ($V_{PHX}$) are at levels corresponding to those of States 1, 2, and 3 of Table 1. For purposes of the present description, if any of the phase voltages at one of the respective output nodes 142, 144, and 146 ($V_{PHX}$) is determined to be equal to or near zero, so as to be equal to the phase voltage output associated with State 3, then that phase voltage (and output node) is considered to have a result (or state) of "0." Further, if any of the phase voltages at one of the respective output nodes 142, 144, and 146 ($V_{PHX}$) is determined to be equal to or near one, so as to be equal to the phase voltage output associated with State 2, then that phase voltage (and output node) is considered to have a result (or state) of "1." Additionally, if any of the phase voltages at one of the respective output nodes 142, 144, and 146 ($V_{PHX}$) is determined to be equal to or near the intermediate output expected phase voltage (again, $V_{PHX-OFF}$, e.g., 0.35 Volts in an embodiment in which S12ZVML128 microcontroller or GD3000 gate driver integrated circuit is employed), so as to be equal to the phase voltage output associated with State 1, then that phase voltage (and output node) is considered to have a result (or state) of "2." Table 2 provides a summary of these results associated with each of these phase voltage conditions at each of the respective output nodes 142, 144, and 146 as can be detected/sampled by the microcontroller unit 124.

TABLE 2

| $V_{PHX}$-Phase PHX Sampled Voltage ($V_{PHA}$, $V_{PHB}$, or $V_{PHC}$) | Result |
|---|---|
| Equal or Near Zero | 0 |
| Equal or Near $V_{HD}$ (Non-Zero Bias Voltage) | 1 |
| Equal or Near $V_{PHX-OFF}$ = 0.35 v | 2 |

The steps of the testing process of FIG. 7 involve voltage sampling by the microcontroller unit 124 of voltage signals that are indicative of each of the phase voltages ($V_{PHX}$, e.g., $V_{PHA}$, $V_{PHX}$, and $V_{PHC}$) at each of the first, second, and third output nodes 142, 144, and 146 of the first, second, and third pairs of switching transistors 132, 134, and 136 (again, for example, as are provided in embodiments involving 3 phase BLDC motors or PMSMs). Different ones of the steps of the testing process entail different manners of actuating the different top and bottom transistors 138, 140 of the first, second, and third pairs of switching transistors 132, 134, and 136 and consequently the results obtained during those different steps can indicate that different ones of the possible faults have occurred, and/or can indicate in different manners that components/portions of the electric motor system 100 are operating normally. Tables 3, 4, and 5 are additionally provided below, as a supplement to the description regarding FIG. 7, to illustrate different voltage phase sampling results that can occur as the different steps of the testing process are performed depending upon whether the electric motor system 100 is operating normally or whether any fault as incurred. Tables 3, 4, 5, particularly illustrate whether various voltage phase sampling results that are obtained during various steps of the testing process indicate normal operation by the electric motor system 100 or alternatively indicate that a fault has occurred and, if so, further indicate which fault has occurred.

Referring now to FIG. 7, the testing process represented by the flow chart 720 begins at a start step 700 (or simply Step 0). At the start step 700, the system (or user) verifies that the electric motor system 100 is powered on, that the electric motor 102 is connected to the electric motor control system 104, and that any software associated with the electric motor control system 104 (e.g., on the microcontroller unit 124) is operating or running in a normal manner, even though at this time the electric motor 102 is still not running (because this is an off-state diagnostic phase of operation). An arrow 725 indicates that the start step 700 can be performed repeatedly. Also, at the start step 700, the system (or user) obtains or confirms the intermediate output expected phase voltage ($V_{PHX-OFF}$) value from the test process. Again, for example, if the electric motor control system 104 employs the S12ZVML128 microcontroller or GD3000 gate driver integrated circuit, then $V_{PHX-OFF}$ will equal 0.35 Volts. The $V_{PHX-OFF}$ value can be understood as a residual voltage that comes from current source flow versus the resistor divider. That is, there are some currents that are pushed into and pulled from a source node (e.g., HSx node) when the driver is biased, on top of the voltage divider used to sense the phase voltage. The $V_{PHX-OFF}$ value can be understood to be the equilibrium of the sum of the currents vs the resistor divider and whatever external leakage may be. The $V_{PHX-OFF}$ value is fairly independent of supply. The currents provided to control the output devices are controlled but have variance. Even so, although the $V_{PHX-OFF}$ value may experience some variance (or variation) from device to device and over temperature, for real electronic control unit (ECU) products, the $V_{PHX-OFF}$ value can be tested and recorded.

Following the start step 700 is a first step 701 (or simply Step 1), which includes first, second, and third substeps 741, 721, and 731, respectively. During the first substep 741 of the first step 701, the microcontroller unit 124 causes the driver 126 to switch off all of the top and bottom transistors 138 and 140 of each of the pairs of switching transistors 132, 134, 136 of the inverter bridge 128 (as shown in FIG. 1).

Further, during the second substep 721 of the first step 701, the microcontroller unit 124 samples and compares (or detects or measures the value of) a voltage signal that is indicative of the bias voltage ($V_{HD}$) from the non-zero bias voltage source 148, and that is provided via the first resistor divider 166 linking that voltage source with the first ADC port 180. Also, during the second substep 721 of the first step 701, the microcontroller unit 124 additionally samples and compares (or detects or measures the values of) respective voltage signals that are indicative of each of the phase voltages ($V_{PHA}$, $V_{PHB}$, and $V_{PHC}$) at the first, second, and third output nodes 142, 144, and 146, and that are provided by way of the second, third, and fourth resistor dividers 168, 170, and 172 linking those respective output nodes with the respective second, third, and fourth ADC ports 182, 184, and 186, respectively. In this manner, the microcontroller unit 124 is able to indirectly detect the phase voltages ($V_{PHA}$, $V_{PHB}$, and $V_{PHC}$) at the first, second, and third output nodes 142, 144, and 146, based upon the voltage signals communicated from the bias voltage source 148 and the output nodes via the resistor dividers 166, 168, 170, and 172.

Then, at the third substep 731 of the first step 701, the microcontroller unit 124 makes a determination of whether any fault appears to be present based upon the sampled, compared voltage signals, or whether the electric motor system 100 appears to be operating normally. In particular, if each of the phase voltages from the first, second, and third output nodes 142, 144, and 146, respectively, is determined to have a value that is equal to or near $V_{PHX-OFF}$, so as to constitute a "2" result as described above (for example, each of $V_{PHA}$, $V_{PHB}$, and $V_{PHC}$ equals or substantially equals or approximates 0.35 Volts), then this is a first indication that all of the switching transistors are working properly and are properly switched to the off state and no fault is determined to have occurred, and so the process advances to a second step 702 (or Step 2). Such a circumstance is shown in Table 3 in the "Normal" row in the "Step 1" column, in which "2" result is shown in each of the columns corresponding to the phase voltages $V_{PHA}$, $V_{PHB}$, and $V_{PHC}$.

However, if each of the phase voltages from the output nodes 142, 144, and 146 is determined to correspond to a "1"

result as described above (that is, the sampled, compared phase voltage in each case is determined to be equal to or near $V_{HD}$), then the microcontroller unit 124 will determine at the third substep 731 of the step 701 that the first type of fault has occurred as shown in FIG. 2, in which one of the top transistors 138 is providing a short circuit to the non-zero bias voltage source 148 ("short to HD"). It should be appreciated that this circumstance can occur due to a fault associated with any one of the top transistors 138 (At, Bt, and Ct) of the first, second, and third pairs of switching transistors 132, 134, and 136 due to the output nodes 142, 144, and 146 all being coupled with one another by way of the first, second, and third phase windings 106, 108, and 110 of the electric motor 102 (provided there is no motor phase loss). Thus, this circumstance is shown in Table 3 to occur in each of three rows of the "Step 1" column, namely, the rows "At Short to HD", "Bt Short to HD," and "Ct Short to HD."

each of the sampled, compared phase voltages. More particularly, with respect to the "Step 1" column of Table 3, it can be noted that the expected result of "2" for each of the sampled, compared phase voltages will still occur even if there are any of the third, fourth, and fifth faults described above involving one of the top and bottom transistors 138 and 140 being open circuited or if there is a motor phase loss (that is, as shown in the rows "At Open Circuit," "Ab Open Circuit," "Bt Open Circuit," "Bb Open Circuit," "Ct Open Circuit," "Cb Open Circuit," "Phase A Loss," "Phase B Loss," and "Phase C Loss").

Assuming that no fault is identified during the first step 701 such that the testing process continues, the testing process advances to a second step 702 (or simply Step 2). The second step 702 includes first, second, and third substeps 742, 722, and 732, respectively. At the first substep 742, the microcontroller unit 124 causes the driver 126 to

TABLE 3

| Single Fault | STEP1 OFF | | | STEP2 At ON | | | STEP3 OFF | STEP4 Ab ON | | |
|---|---|---|---|---|---|---|---|---|---|---|
| | $V_{PHA}$ | $V_{PHB}$ | $V_{PHC}$ | $V_{PHA}$ | $V_{PHB}$ | $V_{PHC}$ | | $V_{PHA}$ | $V_{PHB}$ | $V_{PHC}$ |
| Normal | 2 | 2 | 2 | 1 | 1 | 1 | | 0 | 0 | 0 |
| At Short to HD | 1 | 1 | 1 | | | | | | | |
| At Open Circuit | 2 | 2 | 2 | 2 | 2 | 2 | | | | |
| Ab Short to GND | 0 | 0 | 0 | | | | | | | |
| Ab Open Circuit | 2 | 2 | 2 | 1 | 1 | 1 | | 2 | 2 | 2 |
| Bt Short to HD | 1 | 1 | 1 | | | | | | | |
| Bt Open Circuit | 2 | 2 | 2 | 1 | 1 | 1 | | 0 | 0 | 0 |
| Bb Short to GND | 0 | 0 | 0 | | | | | | | |
| Bb Open Circuit | 2 | 2 | 2 | 1 | 1 | 1 | | 0 | 0 | 0 |
| Ct Short to HD | 1 | 1 | 1 | | | | | | | |
| Ct Open Circuit | 2 | 2 | 2 | 1 | 1 | 1 | | 0 | 0 | 0 |
| Cb Short to GND | 0 | 0 | 0 | | | | | | | |
| Cb Open Circuit | 2 | 2 | 2 | 1 | 1 | 1 | | 0 | 0 | 0 |
| Phase A Loss | 2 | 2 | 2 | 1 | 2 | 2 | | | | |
| Phase B Loss | 2 | 2 | 2 | 1 | 2 | 1 | | | | |
| Phase C Loss | 2 | 2 | 2 | 1 | 1 | 2 | | | | |

Further, if each of the phase voltages from the output nodes 142, 144, and 146 is determined to correspond to a "0" result as described above (that is, the sampled, compared phase voltage in each case is determined to be equal to or near zero), then the microcontroller unit 124 will determine at the third substep 731 of the step 701 that the second type of fault has occurred as shown in FIG. 3, in which one of the bottom resistors 140 is providing a short circuit to the ground terminal 150 ("short to GND"). Again, this circumstance can occur due to a fault associated with any one of the bottom transistors 140 (Ab, Bb, and Cb) of the first, second, and third pairs of switching transistors 132, 134, and 136 due to the output nodes 142, 144, and 146 all being coupled with one another by way of the first, second, and third phase windings 106, 108, and 110. Thus, this circumstance is shown in Table 3 to occur in each of three rows of the "Step 1" column, namely, the rows "Ab Short to GND", "Bb Short to GND," and "Cb Short to GND."

If a fault is detected by the microcontroller unit 124 during the third substep 731 of the step 701 of the testing process, due to any of the top and bottom transistors 138 and 140 creating a short circuit either to the non-zero bias voltage source 148 or to the ground terminal 150, then the testing process proceeds to an end process step 760 and the process ends. However, it is possible that other types of faults may be present and yet the testing process will proceed, when the expected result of "2" is achieved for switch ON the top transistor 138 of the first pair of switching transistors 132 (At), so as to be conductive.

Further, at the second substep 722 of the 702, the microcontroller unit 124 samples and compares (or detects or measures the value of) a voltage signal that is indicative of the bias voltage ($V_{HD}$) from the non-zero bias voltage source 148, and that is provided via the first resistor divider 166 linking that voltage source with the first ADC port 180. Also, during the second substep 722, the microcontroller unit 124 additionally samples and compares (or detects or measures the values of) respective voltage signals that are indicative of each of the phase voltages ($V_{PHA}$, $V_{PHB}$, and $V_{PHC}$) at the first, second, and third output nodes 142, 144, and 146, and that are provided by way of the second, third, and fourth resistor dividers 168, 170, and 172 linking those output nodes with the respective second, third, and fourth ADC ports 182, 184, and 186, respectively. In this manner, the microcontroller unit 124 is able to indirectly detect the phase voltages ($V_{PHA}$, $V_{PHB}$, and $V_{PHC}$) at the first, second, and third output nodes 142, 144, and 146, based upon the voltage signals communicated from the bias voltage source 148 and the output nodes via the resistor dividers 166, 168, 170, and 172.

Further, at the third substep 732, the microcontroller unit 124 makes a determination of whether a fault has occurred or whether the electric motor system 100 is operating normally (at least as determined thus far in the testing process). If each of the phase voltages from the first, second, and third output nodes 142, 144, and 146, respectively ($V_{PHA}$, $V_{PHB}$, and $V_{PHC}$, respectively), is determined to have a value that is equal to or near the bias voltage of the non-zero bias voltage source 148 ($V_{HD}$), so as to constitute a "1" result as described above, then this is a further indication that all of the switching transistors is working properly and no fault is determined to have occurred, and so the process advances to a third step 703 (or Step 3). Such a circumstance is shown in Table 3 in the "Normal" row in the "Step 2" column (in which the "1" result is shown in each of the columns corresponding to the phase voltages $V_{PHA}$, $V_{PHB}$, and $V_{PHC}$). It should be appreciated that, in this circumstance, the phase voltage at the first output node 142 achieves the "1" result because the top transistor 138 of the first pair of switching transistors 132 is switched ON, and that the phase voltages at the second and third output nodes 144 and 146 achieve the "1" result due to the output nodes 142, 144, and 146 all being coupled with one another by way of the first, second, and third phase windings 106, 108, and 110 of the electric motor 102 (provided there is no motor phase loss).

However, if the phase voltages from the output nodes 142, 144, and 146 during the second step 702 are determined to have other results, then this is indicative of a fault, and the testing process proceeds to the end process step 760 and the process ends. In such circumstances, the microcontroller unit 124 can determine the type of fault that has occurred based upon the particular results associated with the phase voltages at the output nodes 142, 144, and 146. More particularly, if each of the phase voltages ($V_{PHA}$, $V_{PHB}$, and $V_{PHC}$) is determined to be equal to or near $V_{PHX\text{-}OFF}$ (e.g., 0.35 V) such that each of those phase voltages achieves a result of "2", then the microcontroller unit 124 at the third substep 732 of the step 702 will determine that the third type of fault has occurred as shown in FIG. 4, with respect to the top transistor 138 of the first pair of switching transistors 132. That is, if each of the phase voltages achieves a result of "2" during the second step 702, this indicates that the top transistor 138 of the first pair of switching transistors 132 has not been successfully switched ON but rather is open-circuited. This circumstance is shown in Table 3 to occur in the third row of the "Step 2" column, namely, at the row "At Open Circuit."

Alternatively, if any one of the phase voltages at any one of the output nodes 142, 144, and 146 achieves a result of "1" but one or both of the remaining two of the phase voltages at the other two of the output nodes achieve(s) a result of "2," then the microcontroller unit 124 at the third substep 732 of the step 702 will determine that the fifth type of fault involving a motor phase loss has occurred as shown in FIG. 6. Whether the motor phase loss relates to the first, second, and third phase windings 106, 108, and 110 can be determined based upon the particular phase voltages that occur at the respective output nodes 142, 144, and 146. More particularly, as shown in the respective "Phase A Loss," "Phase B Loss," and "Phase C Loss" rows of the "Step 2" column of Table 3, the microcontroller unit 124 will determine that the fifth type of fault involving a motor phase loss pertains to the first (phase A) phase winding 106 if the phase voltages for the first, second, and third output nodes 142, 144, 146 ($V_{PHA}$, $V_{PHB}$, and $V_{PHC}$) achieve results of "1," "2," and "2," respectively. Alternatively, the microcontroller unit 124 will determine that the fifth type of fault involving a motor phase loss pertains to the second (phase B) phase winding 108 if the phase voltages for the first, second, and third output nodes 142, 144, and 146 achieve results of "1," "2," and "1," respectively. Further, the microcontroller unit 124 will determine that the fifth type of fault involving a motor phase loss pertains to the third (phase C) phase winding 110 if the phase voltages for the first, second, and third output nodes 142, 144, and 146 achieve results of "1," "1," and "2," respectively.

Assuming that no fault is identified during the second step 702 and the process advances to the third step 703, then at that step the microcontroller unit 124 will cause the driver 126 to switch OFF each of the top transistors 138 and each of the bottom transistors 140 of the inverter bridge 128. To this extent, the third step 703 is identical to the first substep 741 of the first step 701. However no sampling and comparing of any voltage signals indicative of the phase voltages at the output nodes 142, 144, and 146 is performed during the third step 703, nor are any determinations made by the microcontroller unit 124 at the third step 703 as to whether the electric motor system 100 is operating normally or any fault has occurred. Rather, upon switching OFF all of the transistors of the inverter bridge 128, the process next performs a fourth step 704.

The fourth step 704 includes first, second, and third substeps 714, 724, and 734, respectively. At the first substep 714 of the fourth step 704 (or Step 4), the microcontroller unit 124 causes the driver 126 to switch ON the bottom transistor 140 of the first pair of switching transistors 132 (Ab), so as to be conductive. Assuming that the bottom transistor 140 of the first pair of switching transistors 132 is operating properly, the phase voltage ($V_{PHA}$) at the first output node 142 should take on a voltage equal to zero, or nearly equal to zero, due to being coupled to the ground terminal 150 by way of that transistor.

Further, at the second substep 724 of the fourth step 704, the microcontroller unit 124 samples and compares (or detects or measures the value of) a voltage signal that is indicative of the bias voltage ($V_{HD}$) from the non-zero bias voltage source 148, and that is provided via the first resistor divider 166 linking that voltage source with the first ADC port 180. Also, during the second substep 724, the microcontroller unit 124 additionally samples and compares (or detects or measures the values of) respective voltage signals that are indicative of each of the phase voltages ($V_{PHA}$, $V_{PHB}$, and $V_{PHC}$) at the first, second, and third output nodes 142, 144, and 146, and that are provided by way of the second, third, and fourth resistor dividers 168, 170, and 172 linking those output nodes with the respective second, third, and fourth ADC ports 182, 184, and 186, respectively. In this manner, the microcontroller unit 124 is able to indirectly detect the phase voltages ($V_{PHA}$, $V_{PHB}$, and $V_{PHC}$) at the first, second, and third output nodes 142, 144, and 146, based upon the voltage signals communicated from the bias voltage source 148 and the output nodes via the resistor dividers 166, 168, 170, and 172.

Further, at the third substep 734, the microcontroller unit 124 makes a determination of whether a fault has occurred or whether the electric motor system 100 is operating normally (at least as determined thus far in the testing process). If each of the phase voltages from the first, second, and third output nodes 142, 144, and 146, respectively ($V_{PHA}$, $V_{PHB}$, and $V_{PHC}$, respectively) is determined to have a value that is equal to (or nearly) zero so as to constitute a "0" result as described above, then this is an additional indication that all of the switching transistors are working properly and no fault is determined to have occurred. Such a circumstance is shown in Table 3 in the "Normal" row in the "Step 4" column (in which the "0" result is shown in each of the columns corresponding to the phase voltages $V_{PHA}$, $V_{PHB}$, and $V_{PHC}$.) It should be appreciated that, in this circumstance, the phase voltage at the first output node 142 achieves the "0" result because the bottom transistor 140 of the first pair of switching transistors 132 is switched ON, and that the phase voltages at the second and third output nodes 144 and 146 achieve the "0" result due to the output nodes 142, 144, and 146 all being coupled with one another by way of the first, second, and third phase windings 106, 108, and 110 of the electric motor 102 (provided there is no motor phase loss). Upon the microcontroller unit 124 determining that the results achieved at the fourth step 704 are consistent with normal operation, the process advances to a fifth step 705 (or Step 5).

However, if the phase voltages from the output nodes 142, 144, and 146 during the fourth step 704 achieve other results, then this is indicative of a fault and the testing process proceeds to the end process step 760 and the process ends. In particular, if each of the phase voltages ($V_{PHA}$, $V_{PHB}$, and $V_{PHC}$) is determined to be equal to or near $V_{PHX-OFF}$ (e.g., 0.35 V) such that each of those phase voltages achieves a result of "2", then the microcontroller unit 124 at the fourth step 704 will determine that the fourth type of fault has occurred as shown in FIG. 5, with respect to the bottom transistor 140 of the first pair of switching transistors 132. That is, if each of the phase voltages achieves a result of "2" during the fourth step 704, this indicates that the bottom transistor 140 of the first pair of switching transistors 132 has not been successfully switched ON but rather is open-circuited. This circumstance is shown in Table 3 to occur in the fifth row of the "Step 4" column, namely, the row "Ab Open Circuit."

Assuming that no fault is identified during the fourth step 704, and the process advances to the fifth step 705, then at that step the microcontroller unit 124 will cause the driver 126 to switch OFF each of the top transistors 138 and each of the bottom transistors 140 of the inverter bridge 128. To this extent, the fifth step 705 is identical to the third step 703. Upon switching OFF all of the transistors of the inverter bridge 128, the process next performs a sixth step 706.

The sixth step 706 includes first, second, and third substeps 716, 726, and 736, respectively. At the first substep 716 of the sixth step 706 (or Step 6), the microcontroller unit 124 causes the driver 126 to switch ON the top transistor 138 of the second pair of switching transistors 134 (Bt), so as to be conductive. Assuming that the top transistor 138 of the second pair of switching transistors 134 is operating properly, the phase voltage (V PHB) at the second output node 144 should take on a value that is equal to or near the bias voltage of the non-zero bias voltage source 148 ($V_{HD}$), due to being coupled to the non-zero bias voltage source 148 by way of that transistor.

TABLE 4

| Single Fault | STEP5 OFF | STEP6 Bt ON | | | STEP7 OFF | STEP8 Bb On | | | STEP9 OFF |
|---|---|---|---|---|---|---|---|---|---|
| | | $V_{PHA}$ | $V_{PHB}$ | $V_{PHC}$ | | $V_{PHA}$ | $V_{PHB}$ | $V_{PHC}$ | |
| Normal | | 1 | 1 | 1 | | 0 | 0 | 0 | |
| At Short to HD | | | | | | | | | |
| At Open Circuit | | | | | | | | | |
| Ab Short to GND | | | | | | | | | |
| Ab Open Circuit | | | | | | | | | |
| Bt Short to HD | | | | | | | | | |
| Bt Open Circuit | | 2 | 2 | 2 | | | | | |
| Bb Short to GND | | | | | | | | | |
| Bb Open Circuit | | 1 | 1 | 1 | | 2 | 2 | 2 | |
| Ct Short to HD | | | | | | | | | |
| Ct Open Circuit | | 1 | 1 | 1 | | 0 | 0 | 0 | |
| Cb Short to GND | | | | | | | | | |
| Cb Open Circuit | | 1 | 1 | 1 | | 0 | 0 | 0 | |
| Phase A Loss | | | | | | | | | |
| Phase B Loss | | | | | | | | | |
| Phase C Loss | | | | | | | | | |

Additionally, during the second substep 726 of the step 706, the microcontroller unit 124 samples and compares (or detects or measures the value of) a voltage signal that is indicative of the bias voltage ($V_{HD}$) from the non-zero bias voltage source 148, and that is provided via the first resistor divider 166 linking that voltage source with the first ADC port 180. Also, during the second substep 726, the microcontroller unit 124 additionally samples and compares (or detects or measures the values of) respective voltage signals that are indicative of each of the phase voltages ($V_{PHA}$, $V_{PHB}$, and $V_{PHC}$) at the first, second, and third output nodes 142, 144, and 146, and that are provided by way of the second, third, and fourth resistor dividers 168, 170, and 172 linking those nodes with the respective second, third, and fourth ADC ports 182, 184, and 186, respectively. In this manner, the microcontroller unit 124 is able to indirectly detect the phase voltages ($V_{PHA}$, $V_{PHB}$, and $V_{PHC}$) at the first, second, and third output nodes 142, 144, and 146, based upon the voltage signals communicated from the bias voltage source 148 and the output nodes via the resistor dividers 166, 168, 170, and 172.

Further, at the third substep 736, the microcontroller unit 124 makes a determination of whether a fault has occurred or whether the electric motor system 100 is operating normally (at least as determined thus far in the testing process). If each of the phase voltages from the first, second, and third output nodes 142, 144, and 146, respectively ($V_{PHA}$, $V_{PHB}$, and $V_{PHC}$, respectively) is determined to have a value that is equal (or nearly equal) to the bias voltage ($V_{HD}$) so as to constitute a "1" result as described above, then this is an additional indication that all of the switching transistors are working properly and no fault is determined to have occurred. Such a circumstance is shown in Table 4 in the "Normal" row in the "Step 6" column (in which the "1" result is shown in each of the columns corresponding to the phase voltages $V_{PHA}$, $V_{PHB}$, and $V_{PHC}$). It should be appreciated that, in this circumstance, the phase voltage at the second output node 144 achieves the "1" result because the top transistor 138 of the second pair of switching transistors 134 is switched ON, and that the phase voltages at the second and third output nodes 144 and 146 achieve the "1" result due to the output nodes 142, 144, and 146 all being coupled with one another by way of the first, second, and third phase windings 106, 108, and 110 of the electric motor 102 (provided there is no motor phase loss). Upon the microcontroller unit 124 determining that the results achieved at the sixth step 706 are consistent with normal operation, the process advances to a seventh step 707 (or Step 7).

However, if the phase voltages from the output nodes 142, 144, and 146 during the third substep 736 achieve other results, then this is indicative of a fault and the testing process proceeds to the end process step 760 and the process ends. In particular, if each of the phase voltages ($V_{PHA}$, $V_{PHB}$, and $V_{PHC}$) is equal to or near $V_{PHX-OFF}$ (e.g., 0.35 V) such that each of those phase voltages achieves a result of "2", then the microcontroller unit 124 at the sixth step 706 will determine that the third type of fault has occurred as shown in FIG. 4, with respect to the top transistor 138 of the second pair of switching transistors 134. That is, if each of the phase voltages achieves a result of "2" during the sixth step 706, this indicates that the top transistor 138 of the second pair of switching transistors 134 has not been successfully switched ON but rather is open-circuited. This circumstance is shown in Table 4 to occur in the fifth row of the "Step 6" column, namely, the row "Bt Open Circuit."

Assuming that no fault is identified during the sixth step 706 and the process advances to the seventh step 707, then at that step the microcontroller unit 124 will cause the driver 126 to switch OFF each of the top transistors 138 and each of the bottom transistors 140 of the inverter bridge 128. To this extent, the seventh step 707 again is identical to the third step 703. Upon switching OFF all of the transistors of the inverter bridge 128, the process next performs an eighth step 708.

The eighth step 708 includes first, second, and third substeps 718, 728, and 738, respectively. At the first substep 718 of the eighth step 708 (or Step 8), the microcontroller unit 124 causes the driver 126 to switch ON the bottom transistor 140 of the second pair of switching transistors 134 (Bb), so as to be conductive. Assuming that the bottom transistor 140 of the second pair of switching transistors 134 is operating properly, the phase voltage ($V_{PHB}$) at the second output node 144 should take on a voltage equal to zero, or nearly equal to zero, due to being coupled to the ground terminal 150 by way of that transistor.

Further, during the second substep 728 of the step 708, the microcontroller unit 124 samples and compares (or detects or measures the value of) a voltage that is indicative of the bias voltage ($V_{HD}$) from the non-zero bias voltage source 148, and that is provided via the first resistor divider 166 linking that voltage source with the first ADC port 180. Also, during the second substep 728, the microcontroller unit 124 additionally samples and compares (or detects or measures the values of) respective voltages that are respectively indicative of each of the phase voltages ($V_{PHA}$, $V_{PHB}$, and $V_{PHC}$) at the first, second, and third output nodes 142, 144, and 146, and that are provided by way of the second, third, and fourth resistor dividers 168, 170, and 172 linking those output nodes with the respective second, third, and fourth ADC ports 182, 184, and 186, respectively. In this manner, the microcontroller unit 124 is able to indirectly detect the phase voltages ($V_{PHA}$, $V_{PHB}$, and $V_{PHC}$) at the first, second, and third output nodes 142, 144, and 146, based upon the voltage signals communicated from the bias voltage source 148 and the output nodes via the resistor dividers 166, 168, 170, and 172.

Further, at the third substep 738, the microcontroller unit 124 makes a determination of whether a fault has occurred or whether the electric motor system 100 is operating normally (at least as determined thus far in the testing process). If each of the phase voltages from the first, second, and third output nodes 142, 144, and 146, respectively ($V_{PHA}$, $V_{PHB}$, and $V_{PHC}$, respectively), is determined to have a value that is equal to (or nearly) zero so as to constitute a "0" result as described above, then this is an additional indication that all of the switching transistors are working properly and no fault is determined to have occurred. Such a circumstance is shown in Table 4 in the "Normal" row in the "Step 8" column (in which the "0" result is shown in each of the columns corresponding to the phase voltages $V_{PHA}$, $V_{PHB}$, and $V_{PHC}$) It should be appreciated that, in this circumstance, the phase voltage at the second output node 144 achieves the "0" result because the bottom transistor 140 of the second pair of switching transistors 134 is switched ON, and that the phase voltages at the first and third output nodes 142 and 146 achieve the "0" result due to the output nodes 142, 144, and 146 all being coupled with one another by way of the first, second, and third phase windings 106, 108, and 110 of the electric motor 102 (provided there is no motor phase loss). Upon the microcontroller unit 124 determining that the results achieved at the fourth step 704 are consistent with normal operation, the process advances to a ninth step 709 (or Step 9).

However, if the phase voltages from the output nodes 142, 144, and 146 during the third substep 738 of the eighth step 708 achieve other results, then this is indicative of a fault and the testing process proceeds to the end process step 760 and the process ends. In particular, if each of the phase voltages ($V_{PHA}$, $V_{PHB}$, and $V_{PHC}$) is equal to or near $V_{PHX-OFF}$ (e.g., 0.35 V) such that each of those phase voltages achieves a result of "2", then the microcontroller unit 124 at the eighth step 708 will determine that the fourth type of fault has occurred as shown in FIG. 5, with respect to the bottom transistor 140 of the second pair of switching transistors 134. That is, if each of the phase voltages achieves a result of "2" during the eighth step 708, this indicates that the bottom transistor 140 of the second pair of switching transistors 134 has not been successfully switched ON but rather is open-circuited. This circumstance is shown in Table 4 to occur in the ninth row of the "Step 8" column, namely, the row "Bb Open Circuit."

Assuming that no fault is identified during the eighth step 708, and the process advances to the ninth step 705, then at that step the microcontroller unit 124 will cause the driver 126 to switch OFF each of the top transistors 138 and each of the bottom transistors 140 of the inverter bridge 128. To this extent, the ninth step 709 is again identical to the third step 703. Upon switching OFF all of the transistors of the inverter bridge 128, the process next performs a tenth step 710.

The tenth step 710 includes first, second, and third substeps 750, 760, and 770, respectively. At the first substep 750 of the tenth step 710 (or Step 10), the microcontroller unit 124 causes the driver 126 to switch ON the top transistor 138 of the third pair of switching transistors 136 (Ct), so as to be conductive. Assuming that the top transistor 138 of the third pair of switching transistors 136 is operating properly, the phase voltage ($V_{PHC}$) at the third output node 146 should take on a value that is equal to or near the bias voltage of the non-zero bias voltage source 148 ($V_{HD}$), due to being coupled to the non-zero bias voltage source 148 by way of that transistor.

Further, during the second substep 760 of the tenth step 710, the microcontroller unit 124 samples and compares (or detects or measures the value of) a voltage signal that is indicative of the bias voltage ($V_{HD}$) from the non-zero bias voltage source 148, and that is provided via the first resistor divider 166 linking that voltage source with the first ADC port 180. Also, during the second substep 760, the microcontroller unit 124 additionally samples and compares (or detects or measures the values of) respective voltages signals that are indicative of each of the phase voltages ($V_{PHA}$, $V_{PHB}$, and $V_{PHC}$) at the first, second, and third output nodes 142, 144, and 146, and that are provided by way of the second, third, and fourth resistor dividers 168, 170, and 172 linking those nodes with the respective second, third, and fourth ADC ports 182, 184, and 186, respectively. In this manner, the microcontroller unit 124 is able to indirectly detect the phase voltages ($V_{PHA}$, $V_{PHB}$, and $V_{PHC}$) at the first, second, and third output nodes 142, 144, and 146, based upon the voltage signals communicated from the bias voltage source 148 and the output nodes via the resistor dividers 166, 168, 170, and 172.

Further, at the third substep 770, the microcontroller unit 124 makes a determination of whether a fault has occurred or whether the electric motor system 100 is operating normally (at least as determined thus far in the testing process). If each of the phase voltages from the first, second, and third output nodes 142, 144, and 146, respectively ($V_{PHA}$, $V_{PHB}$, and $V_{PHC}$, respectively) is determined to have a value that is equal to (or nearly to) the bias voltage ($V_{HD}$) so as to constitute a "1" result as described above, then this is an additional indication that all of the switching transistors are working properly and no fault is determined to have occurred. Such a circumstance is shown in Table 5 in the "Normal" row in the "Step 10" column (in which the "1" result is shown in each of the columns corresponding to the phase voltages $V_{PHA}$, $V_{PHB}$, and $V_{PHC}$). It should be appreciated that, in this circumstance, the phase voltage at the third output node 146 achieves the "1" result because the top transistor 138 of the third pair of switching transistors 136 is switched ON, and that the phase voltages at the second and third output nodes 142 and 144 achieve the "1" result due to the output nodes 142, 144, and 146 all being coupled with one another by way of the first, second, and third phase windings 106, 108, and 110 of the electric motor 102 (provided there is no motor phase loss). Upon the microcontroller unit 124 determining that the results achieved at the tenth step 710 are consistent with normal operation, the process advances to an eleventh step 711 (or Step 11).

However, if the phase voltages from the output nodes 142, 144, and 146 during the third substep 770 of the tenth step 710 achieve other results, then this is indicative of a fault and the testing process proceeds to the end process step 760 and the process ends. In particular, if each of the phase voltages ($V_{PHA}$, $V_{PHB}$, and $V_{PHC}$) is equal to or near $V_{PHX-OFF}$ (e.g., 0.35 V) such that each of those phase voltages achieves a result of "2", then the microcontroller unit 124 at the tenth step 710 will determine that the third type of fault has occurred as shown in FIG. 4, with respect to the top transistor 138 of the third pair of switching transistors 134. That is, if each of the phase voltages achieves a result of "2" during the tenth step 710, this indicates that the top transistor 138 of the third pair of switching transistors 136 has not been successfully switched ON but rather is open-circuited. This circumstance is shown in Table 5 to occur in the eleventh row of the "Step 10" column, namely, the row "Ct Open Circuit."

Assuming that no fault is identified during the tenth step 710 and the process advances to the eleventh step 711, then at that step the microcontroller unit 124 will cause the driver 126 to switch OFF each of the top transistors 138 and each of the bottom transistors 140 of the inverter bridge 128. To this extent, the eleventh step 711 is again identical to the third steps 703. Upon switching OFF all of the transistors of the inverter bridge 128, the process next performs a twelfth step 712.

The twelfth step 712 includes first, second, and third substeps 752, 762, and 772, respectively. At the first substep 752 of the twelfth step 712 (or Step 12), the microcontroller unit 124 causes the driver 126 to switch ON the bottom transistor 140 of the third pair of switching transistors 136 (Cb), so as to be conductive. Assuming that the bottom transistor 140 of the third pair of switching transistors 136 is operating properly, the phase voltage ($V_{PHC}$) at the third output node 146 should take on a voltage equal to zero, or nearly equal to zero, due to being coupled to the ground terminal 150 by way of that transistor.

Further, during the second substep 762 of the step 712, the microcontroller unit 124 samples and compares (or detects or measures the value of) a voltage that indicative of the bias voltage ($V_{HD}$) from the non-zero bias voltage source 148, and that is provided via the first resistor divider 166 linking that voltage source with the first ADC port 180. Also, during the second substep 762, the microcontroller unit 124 additionally samples and compares (or detects or measures the values of) respective voltage signals that are indicative of each of the phase voltages ($V_{PHA}$, $V_{PHB}$, and $V_{PHC}$) at the first, second, and third output nodes 142, 144, and 146, and that are provided by way of the second, third, and fourth resistor dividers 168, 170, and 172 linking those nodes with the respective second, third, and fourth ADC ports 182, 184, and 186, respectively. In this manner, the microcontroller unit 124 is able to indirectly detect the phase voltages ($V_{PHA}$, $V_{PHB}$, and $V_{PHC}$) at the first, second, and third output nodes 142, 144, and 146, based upon the voltage signals communicated from the bias voltage source 148 and the output nodes via the resistor dividers 166, 168, 170, and 172.

Further, at the third substep 772, the microcontroller unit 124 makes a determination of whether a fault has occurred or whether the electric motor system 100 is operating normally. If each of the phase voltages from the first, second, and third output nodes 142, 144, and 146, respectively ($V_{PHA}$, $V_{PHB}$, and $V_{PHC}$, respectively) is determined to have a value that is equal to (or nearly) zero so as to constitute a "0" result as described above, then this is an additional indication that all of the switching transistors are working properly and no fault is determined to have occurred. Such a circumstance is shown in Table 5 in the "Normal" row in the "Step 12" column (in which the "0" result is shown in each of the columns corresponding to the phase voltages $V_{PHA}$, $V_{PHB}$, and $V_{PHC}$). It should be appreciated that, in this circumstance, the phase voltage at the third output node 146 achieves the "0" result because the bottom transistor 140 of the third pair of switching transistors 136 is switched ON, and that the phase voltages at the first and second output nodes 142 and 144 achieve the "0" result due to the output nodes 142, 144, and 146 all being coupled with one another by way of the first, second, and third phase windings 106, 108, and 110 of the electric motor 102 (provided there is no motor phase loss). Upon the microcontroller unit 124 determining that the results achieved at the twelfth step 712 are consistent with normal operation, the process advances to a thirteenth step 713 (or Step 713).

However, if the phase voltages from the output nodes 142, 144, and 146 during the third substep 772 achieve other results, then this is indicative of a fault and the testing process proceeds to the end process step 760 and the process ends. In particular, if each of the phase voltages ($V_{PHA}$, $V_{PHB}$, and $V_{PHC}$) is equal to or near $V_{PHX-OFF}$ (e.g., 0.35 V) such that each of those phase voltages achieves a result of "2", then the microcontroller unit 124 at the twelfth step 712 will determine that the fourth type of fault has occurred as shown in FIG. 5, with respect to the bottom transistor 140 of the third pair of switching transistors 136. That is, if each of the sampled, compared phase voltages achieves a result of "2" during the twelfth step 712, this indicates that the bottom transistor 140 of the third pair of switching transistors 136 has not been successfully switched ON but rather is open-circuited. This circumstance is shown in Table 5 to occur in the thirteenth row of the "Step 12" column, namely, the row "Cb Open Circuit."

TABLE 5

| Single Fault | STEP10 Ct ON | | | STEP11 OFF | STEP12 Cb ON | | | STEP13 OFF |
|---|---|---|---|---|---|---|---|---|
| | $V_{PHA}$ | $V_{PHB}$ | $V_{PHC}$ | | $V_{PHA}$ | $V_{PHB}$ | $V_{PHC}$ | |
| Normal | 1 | 1 | 1 | | 0 | 0 | 0 | |
| At Short to HD | | | | | | | | |
| At Open Circuit | | | | | | | | |
| Ab Short to GND | | | | | | | | |
| Ab Open Circuit | | | | | | | | |
| Bt Short to HD | | | | | | | | |
| Bt Open Circuit | | | | | | | | |
| Bb Short to GND | | | | | | | | |
| Bb Open Circuit | | | | | | | | |
| Ct Short to HD | | | | | | | | |
| Ct Open Circuit | 2 | 2 | 2 | | | | | |
| Cb Short to GND | | | | | | | | |
| Cb Open Circuit | 1 | 1 | 1 | | 2 | 2 | 2 | |
| Phase A Loss | | | | | | | | |
| Phase B Loss | | | | | | | | |
| Phase C Loss | | | | | | | | |

Finally, if the testing process of FIG. 7 advances to the thirteenth step 713, the testing process will not have detected any faults and so the testing process can be completed. In this regard, at the thirteenth step 713, microcontroller unit 124 again causes the driver 126 to switch OFF each of the top transistors 138 and each of the bottom transistors 140 of the inverter bridge 128. To this extent, the thirteenth step 713 again is identical to the third step 703. Upon switching OFF all of the transistors of the inverter bridge 128, the testing process can proceed to the end process step 760 and end (as illustrated), or return to the first step 701 (or to the start step 700). Alternatively, upon the switching OFF of all of the transistors of the inverter bridge 128, the electric motor control system (or the microcontroller unit 124 thereof) can take one or more additional actions. For example, in at least some embodiments, the microcontroller unit 124 can cause a notification signal to be provided to an operator indicating that the electric motor system testing process is complete and that the system appears to be operating normally. Also, in at least some embodiments, the microcontroller unit 124 can automatically cause operation of the electric motor 102 to begin.

Notwithstanding the above description, the present disclosure is intended to encompass numerous embodiments including those disclosed herein as well as a variety of alternate embodiments. For example, although the embodiment described above in regard to FIG. 1 envisions the use of the resistor dividers 130 to facilitate the sampling or detection of phase voltages, resistor dividers need not be utilized in all embodiments. For example, the present disclosure is also intended to encompass embodiments in which resistance dividers are not required or employed for voltage sampling (in some implementations involving at least some MagniV® microcontrollers). Also for example, although the embodiment of FIG. 1 entails the inverter bridge 128 that is a three phase full bridge suitable for operation in relation to some types of motors (e.g., BLDC motors and PMSMs), the present disclosure is also intended to encompass alternate embodiments suited for other types of motors. For example, in one alternate embodiment suited for operation with a DC motor, the electric motor control system can include a half bridge arrangement. In some embodiments encompassed herein, such as those employing S12ZVM, S12ZVMA, and ZVMB microcontroller units as are available from NXP Semiconductors, N.V., the testing processes (or diagnostic/detection methods) are helpful for diagnosing MOSFET faults and motor phase loss faults before the starting of a motor (OFF state), because the phase voltage feedback circuit is already build in. In additional embodiments, the testing processes also can be implemented in hardware such as gate driver units (GDUs) or S32M microcontroller units, as are available from NXP Semiconductors, N.V.

Further, in at least some example embodiments encompassed herein, the present disclosure relates to a method of diagnosing a fault associated with an electric motor system, the electric motor system including an electric motor control system and an electric motor, the electric motor control system including an inverter bridge having first, second, and third pairs of switching transistors respectively having respective first and second transistors coupled together at respective first, second, and third output nodes, which are respectively coupled to first, second, and third phase windings of the electric motor. The method includes causing each of the first and second transistors of the first, second, and third pairs of switching transistors to be switched off. The method also includes causing the respective first transistor of the first pair of switching transistors to be switched on, detecting respective first phase voltage signals communicated from the first, second, and third output nodes indicative of respective first phase voltages, and determining whether the respective first phase voltage signals that have been detected indicate that a first fault has occurred in regard to the electric motor system, either with respect to one or more of the respective first and second transistors of the first, second, and third pairs of switching transistors or with respect to one or more of the first, second, and third phase windings. Further, the method also includes, in response to determining the first fault has not occurred, causing the respective first transistor of the first pair of switching transistors to be switched off and causing an additional one of the first and second transistors of the first, second, and third pairs of switching transistors to be switched on, the additional one differing from the respective first transistor of the first pair, detecting respective second voltage phase signals communicated from the first, second, and third output nodes indicative of respective second phase voltages, and determining whether the respective second phase voltage signals that have been detected indicate that a second fault has occurred in regard to the electric motor system.

Further, in at least some example embodiments encompassed herein, the present disclosure relates to a method of diagnosing a fault associated with an electric motor system, the electric motor system including an electric motor control system and an electric motor, the electric motor control system including an inverter bridge having first, second, and third pairs of switching transistors respectively having respective first and second transistors coupled together at respective first, second, and third output nodes, which are respectively coupled to first, second, and third phase windings of the electric motor. The method includes (a) determining an intermediate output voltage that is between a ground voltage and a bias voltage, and that is present at each of the first, second, and third output nodes while all of the first and second transistors of the first, second, and third pairs of switching transistors are switched off, and (b) causing either (1) each of the first and second transistors of the first, second, and third pairs of switching transistors to be switched off, or (2) a first one of the first or second transistors of the first, second, and third pairs of switching transistors to be switched on. Also, the method additionally includes (c) detecting respective phase voltage signals communicated from the first, second, and third output nodes indicative of respective phase voltages occurring at the first, second, and third output nodes, respectively, and (d) determining whether the respective phase voltage signals that have been detected indicate that a first fault has occurred in regard to the electric motor system, either with respect to one or more of the first and second transistors of the first, second, and third pairs of switching transistors or with respect to one or more of the first, second, and third phase windings. The determining is based upon whether the respective phase voltage signals indicate that respective phase voltages present respectively at the first, second, and third output nodes are each equal to or substantially equal to the intermediate output voltage.

Additionally, in at least some example embodiments encompassed herein, the present disclosure relates to an electric motor control system for controlling an electric motor. The electric motor control system includes a microcontroller, a driver, and an inverter bridge having first, second, and third pairs of switching transistors respectively having respective first and second transistors coupled together at respective first, second, and third output nodes, which are respectively configured to be coupled to first, second, and third phase windings of the electric motor. The microcontroller is configured to: (a) determine an intermediate output voltage that is between a ground voltage and a bias voltage, and that is present at each of the first, second, and third output nodes while all of the first and second transistors of the first, second, and third pairs of switching transistors are switched off; (b) cause either (1) each of the first and second transistors of the first, second, and third pairs of switching transistors to be switched off, or (2) a first one of the first or second transistors of the first, second, and third pairs of switching transistors to be switched on; (c) detect respective phase voltage signals communicated from the first, second, and third output nodes indicative of respective phase voltages occurring at the first, second, and third output nodes, respectively; and (d) determine whether the respective phase voltage signals that have been detected indicate that a first fault has occurred in regard to the electric motor system, either with respect to one or more of the first and second transistors of the first, second, and third pairs of switching transistors or with respect to one or more of the first, second, and third phase windings, based upon whether the respective phase voltage signals indicate that respective phase voltages present respectively at the first, second, and third output nodes are each equal to or substantially equal to the intermediate output voltage.

One or more of the embodiments encompassed herein can be advantageous in any of a variety of respects. In at least some embodiments, the systems and methods encompassed herein can perform two functions as part of a single testing process. In particular, such systems and methods not only perform switch fault detection but also perform motor phase loss detection during performance of a single testing process. Further, in least some such embodiments, the switch fault detection that is achieved by this testing process allows for detecting one or both of two types of faults, namely, one or both of a switch short fault and a switch open fault. Additionally, at least some of the systems and methods encompassed herein can perform a testing process in which switch open faults and/or motor phase loss faults not only can be detected, but also can be tracked. Further, in at least some embodiments, no inrush current (or substantially no inrush current) is generated when the testing process is performed—in particular, the testing process (or diagnostic method) is performed based on voltage comparisons and no currents (or substantially no currents) are generated when the testing process is performed. Additionally, in at least some embodiments, the motor phases are not excited during the testing process, and correspondingly no noise is generated by the testing process.

Further, it should be appreciated that, in at least some embodiments, the testing processes described herein can be achieved by way of a simple circuit employing phase voltage and bias voltage resistance divide circuit(s), without complicated external circuits to support the diagnosis (there is no need particularly for any external circuits when employing for MagniV® microcontrollers/products as available from NXP Semiconductors, N.V.). Further, in at least some embodiments encompassed herein, performing of the testing procedures does not involve any delays associated with waiting for currents to ramp up as may be the case with some conventional testing procedures, and so the amount of time to perform testing/diagnostics is less than with respect to at least some conventional testing procedures. Additionally, in at least some embodiments encompassed herein, the testing process can be performed in a manner that involves a small amount of calculation by the microcontroller unit or an algorithm programmed therein. Because the microcontroller unit can govern the testing process with a small amount of calculation, the testing process is efficient. Indeed, the testing process involves a low amount of computing power and the execution time is short, which can be valuable for some applications (e.g., in automotive applications).

While the principles of the invention have been described above in connection with specific apparatus, it is to be clearly understood that this description is made only by way of example and not as a limitation on the scope of the invention. It is specifically intended that the present invention not be limited to the embodiments and illustrations contained herein, but include modified forms of those embodiments including portions of the embodiments and combinations of elements of different embodiments as come within the scope of the following claims.

What is claimed is:

1. A method of diagnosing a fault associated with an electric motor system, the electric motor system including an electric motor control system and an electric motor, the electric motor control system including an inverter bridge having first, second, and third pairs of switching transistors respectively having respective first and second transistors coupled together at respective first, second, and third output nodes, which are respectively coupled to first, second, and third phase windings of the electric motor, the method comprising:
causing each of the first and second transistors of the first, second, and third pairs of switching transistors to be switched off,
causing the respective first transistor of the first pair of switching transistors to be switched on,
detecting respective first phase voltage signals communicated from the first, second, and third output nodes indicative of respective first phase voltages, and
determining whether the respective first phase voltage signals that have been detected indicate that a first fault has occurred in regard to the electric motor system, either with respect to one or more of the respective first and second transistors of the first, second, and third pairs of switching transistors or with respect to one or more of the first, second, and third phase windings; and
in response to determining the first fault has not occurred, causing the respective first transistor of the first pair of switching transistors to be switched off and causing an additional one of the first and second transistors of the first, second, and third pairs of switching transistors to be switched on, the additional one differing from the respective first transistor of the first pair,
detecting respective second phase voltage signals communicated from the first, second, and third output nodes indicative of respective second phase voltages, and
determining whether the respective second phase voltage signals that have been detected indicate that a second fault has occurred in regard to the electric motor system.

2. The method of claim 1, further comprising determining an intermediate output voltage at each of the first, second, and third output nodes while all of the first and second transistors of the first, second, and third pairs of switching transistors are switched off.

3. The method of claim 2, wherein the determining of whether the respective first phase voltage signals indicate that the first fault has occurred is made based upon whether the respective first phase voltage signals indicate that respective first voltages present respectively at the first, second, and third output nodes are each equal to or substantially equal to the intermediate output voltage, wherein the respective first phase voltage signals are communicated via first, second, and third resistor dividers respectively coupled to the first, second, and third output nodes, respectively.

4. The method of claim 3, wherein the first fault is determined to have occurred in response to each of the respective first phase voltage signals indicating that respective first voltages present respectively at the first, second, and third output nodes are each equal to or substantially equal to the intermediate output voltage, and wherein the first fault is an open circuit fault associated at least one of the respective first and second transistors of the first, second, and third pairs of switching transistors.

5. The method of claim 3, wherein the first fault is determined to have occurred in response to each of the respective first phase voltage signals indicating that a first one of the respective first voltages present respectively at the first, second, and third output nodes is equal to or substantially equal to the intermediate output voltage, but that a second one of the respective first voltages present respectively at the first, second, and third output nodes is equal to or substantially equal to a bias voltage, and wherein the first fault is a motor phase loss fault associated at least one of the first, second, and third phase windings.

6. The method of claim 3, wherein it is determined that the first fault has not occurred upon it being determined that each of the first phase voltage signals indicates that the respective first voltages present respectively at each of the first, second, and third output nodes are each equal to or substantially equal to a bias voltage or a ground voltage.

7. The method of claim 3, wherein the determining of whether the respective second phase voltage signals indicate that the second fault has occurred is made based upon whether the respective second phase voltage signals indicate that respective second voltages present respectively at the first, second, and third output nodes are each equal to or substantially equal to the intermediate output voltage, wherein the respective second phase voltage signals are communicated via first, second, and third resistor dividers respectively coupled to the first, second, and third output nodes, respectively.

8. The method of claim 7, wherein it is determined that the second fault has not occurred upon it being determined that each of the second phase voltage signals indicates that the respective second voltages present respectively at each of the first, second, and third output nodes are each equal to or substantially equal to either a bias voltage or a ground voltage.

9. The method of claim 1, wherein the additional one of the first and second transistors of the first, second, and third pairs of switching transistors is the respective second transistor of the first pair, wherein the respective first transistors of the first, second, and third pairs of switching transistors are respectively coupled between first, second, and third output nodes, respectively, and at least one bias voltage source, and wherein the respective second transistors of the first, second, and third pairs of switching transistors are respectively coupled between the first, second, and third output nodes, respectively, and at least one ground terminal.

10. The method of claim 1, further comprising:
in response to determining the second fault has not occurred, causing the additional one of the first and second transistors of the first, second, and third pairs of switching transistors to be switched off and causing a further one of the first and second transistors of the first, second, and third pairs of switching transistors to be switched on, the further one differing from each of the respective first transistor of the first pair and from the additional one, detecting respective third phase voltage signals communicated from the first, second, and third output nodes indicative of respective third phase voltages, and determining whether the respective third phase voltage signals that have been detected are indicative collectively that a third fault has occurred in regard to the electric motor system.

11. The method of claim 1, further comprising, after the causing of each of the first and second transistors of the first, second, and third pairs of switching transistors to be switched off, but prior to the causing of the respective first transistor of the first pair of switching transistors to be switched on:

detecting respective additional phase voltage signals communicated from the first, second, and third output nodes indicative of respective third phase voltages, and determining whether the respective additional phase voltage signals that have been detected are indicative collectively that an additional fault has occurred in regard to the electric motor system, wherein the additional fault either relates to at least one of the first transistors of the first, second, and third pairs of switching transistors operating as a short circuit so as to short the first, second, and third output nodes respectively to at least one bias voltage source, or relates to a least one of the second transistors of the first, second, and third output nodes respectively to at least one ground terminal.

12. The method of claim 1, wherein the determining of whether the respective first phase voltages signals that have been detected are indicative collectively that a second fault has occurred in regard to the electric motor system is performed by a microcontroller unit.

13. The method of claim 12, wherein the microcontroller unit performs the causing of the respective first and second transistors of the first, second, and third pairs of switching transistors to be switched off, the causing of the respective first transistor of the first pair of switching transistors to be switched on, the causing of the respective first transistor of the first pair of switching transistors to be switched off, and the causing of the additional one of the first and second transistors of the first, second, and third pairs of switching transistors to be switched on, by providing a plurality of control signals to a plurality of drivers that in turn respectively provide a plurality of drive signals for receipt by the respective first and second transistors of the first, second, and third pairs of switching transistors.

14. The method of claim 13, wherein each of the first and second transistors of the first, second, and third pairs of switching triggers is a metal oxide semiconductor field effect transistor (MOSFET), and wherein the method can be performed without, or without substantial inrush current.

15. The method of claim 12, further comprising performing, by the microcontroller unit, an additional action upon determining that one of the first fault and the second fault has occurred.

16. A method of diagnosing a fault associated with an electric motor system, the electric motor system including an electric motor control system and an electric motor, the electric motor control system including an inverter bridge having first, second, and third pairs of switching transistors respectively having respective first and second transistors coupled together at respective first, second, and third output nodes, which are respectively coupled to first, second, and third phase windings of the electric motor, the method comprising:

(a) determining an intermediate output voltage that is between a ground voltage and a bias voltage, and that is present at each of the first, second, and third output nodes while all of the first and second transistors of the first, second, and third pairs of switching transistors are switched off;

(b) causing either (1) each of the first and second transistors of the first, second, and third pairs of switching transistors to be switched off, or (2) a first one of the first or second transistors of the first, second, and third pairs of switching transistors to be switched on;

(c) detecting respective phase voltage signals communicated from the first, second, and third output nodes indicative of respective phase voltages occurring at the first, second, and third output nodes, respectively; and (d) determining whether the respective phase voltage signals that have been detected indicate that a first fault has occurred in regard to the electric motor system, either with respect to one or more of the first and second transistors of the first, second, and third pairs of switching transistors or with respect to one or more of the first, second, and third phase windings, wherein the determining is based upon whether the respective phase voltage signals indicate that respective phase voltages present respectively at the first, second, and third output nodes are each equal to or substantially equal to the intermediate output voltage.

17. The method of claim 16, further comprising:

repeating (b) through (d), so as to determine whether one or more additional faults have occurred.

18. The method of claim 16, wherein the determining of whether the respective phase voltage signals that have been detected indicate that a first fault has occurred in regard to the electric motor system results in one of:

1) A first determination that the first fault has not occurred;

2) A second determination that at least one of the first and second transistors of at least one first, second, and third pairs of switching transistors has experienced an open circuit fault that is the first fault;

3) A third determination that at least one of the first and second transistors of at least one first, second, and third pairs of switching transistors has experienced a short circuit fault that is the first fault; and 4) A fourth determination that a motor phase loss fault has occurred in one of the first, second, and third phase windings, the motor phase loss being the first fault.

19. An electric motor control system for controlling an electric motor, the electric motor control system comprising:

a microcontroller;

a driver; and an inverter bridge having first, second, and third pairs of switching transistors respectively having respective first and second transistors coupled together at respective first, second, and third output nodes, which are respectively configured to be coupled to first, second, and third phase windings of the electric motor, wherein the microcontroller is configured to:

(a) determine an intermediate output voltage that is between a ground voltage and a bias voltage, and that is present at each of the first, second, and third output nodes while all of the first and second transistors of the first, second, and third pairs of switching transistors are switched off;

(b) cause either (1) each of the first and second transistors of the first, second, and third pairs of switching transistors to be switched off, or (2) a first one of the first or second transistors of the first, second, and third pairs of switching transistors to be switched on;

(c) detect respective phase voltage signals communicated from the first, second, and third output nodes indicative of respective phase voltages occurring at the first, second, and third output nodes, respectively; and (d) determine whether the respective phase voltage signals that have been detected indicate that a first fault has occurred in regard to the electric motor system, either with respect to one or more of the first and second transistors of the first, second, and third pairs of switching transistors or with respect to one or more of the first, second, and third phase windings, based upon whether the respective phase voltage signals indicate that respective phase voltages present respectively at the first, second, and third output nodes are each equal to or substantially equal to the intermediate output voltage.

20. The system of claim 19, further comprising a plurality of resistor dividers by which the first, second, and third output nodes are at least indirectly coupled to the microcontroller, and by which the microcontroller is configured to receive the respective phase voltage signals.

* * * * *